United States Patent [19]

Ohkubo

[11] 4,296,377

[45] Oct. 20, 1981

[54] MAGNETIC SIGNAL FIELD SENSOR THAT IS SUBSTANTIALLY IMMUNE TO ANGULAR DISPLACEMENT RELATIVE TO THE SIGNAL FIELD

[75] Inventor: Hiroyuki Ohkubo, Chiba, Japan

[73] Assignee: Sony Corporation, Tokyo, Japan

[21] Appl. No.: 23,270

[22] Filed: Mar. 23, 1979

[30] Foreign Application Priority Data

Mar. 27, 1978 [JP] Japan ................... 53-34095
Mar. 27, 1978 [JP] Japan ................... 53-34096
Jun. 20, 1978 [JP] Japan ................. 53-83573[U]

[51] Int. Cl.$^3$ .......................................... G01R 33/06
[52] U.S. Cl. ................................ 324/252; 338/32 R
[58] Field of Search ............. 324/235, 249, 251, 252, 324/247, 260; 338/32 R; 365/158; 360/113

[56] References Cited

U.S. PATENT DOCUMENTS

| | | | |
|---|---|---|---|
| 2,997,648 | 8/1961 | Bozorth | 324/252 |
| 3,405,355 | 10/1968 | Hebbert | 324/252 |
| 3,518,534 | 6/1970 | Bader | 324/249 |
| 3,546,579 | 12/1970 | Paul et al. | 324/252 |
| 3,928,836 | 12/1975 | Makino et al. | 324/252 X |
| 4,021,728 | 5/1977 | Makino et al. | 324/235 X |
| 4,053,829 | 10/1977 | Maruo | 324/252 X |
| 4,079,360 | 3/1978 | Ookubo et al. | 324/252 X |

FOREIGN PATENT DOCUMENTS 1516964 2/1973 Fed. Rep. of Germany ...... 324/252

OTHER PUBLICATIONS

Hebbert et al., "Thin Film Magnetoresistance Magnetometer", *The Review of Scientific Instruments*, vol. 37, No. 10, Oct. 1966, pp. 1321-1323.

Bate et al., "Magnetoresistive Read Heads", *IBM Tech. Discl. Bull.*, vol. 17, No. 4, Sep. 1974, pp. 967-968.

Feng, J. S., "Self-Biased Magnetoresistive ... ", *IBM Tech. Discl. Bull.*, vol. 18, No. 11, Apr. 1976, pp. 3847-3851.

*Primary Examiner*—Gerard R. Strecker
*Attorney, Agent, or Firm*—Lewis H. Eslinger; Alvin Sinderbrand

[57] ABSTRACT

Apparatus is provided for sensing an external magnetic field. This apparatus is comprised of first and second coplanar magnetoresistive elements, each magnetoresistive element having a main current conducting path and also having anisotropic resistance as a function of the direction of the resultant magnetic field applied thereto. First and second equal bias magnetic fields are supplied to the first and second magnetoresistive elements, respectively, these bias magnetic fields being supplied at different angles with respect to their associated magnetoresistive elements. In one embodiment, the current conducting paths of the magnetoresistive elements are perpendicular to each other, and the respective bias magnetic fields extend in opposite directions, these directions being parallel to one of the main current conducting paths. In another embodiment, the main current conducting paths of the respective magnetoresistive elements extend in the same direction, and the respective bias magnetic fields are at an angle of, for example ±45° to these main current conducting paths. The first and second magnetoresistive elements are connected in series with each other, and a d.c. current is supplied to this series connection. An output signal representing the magnitude of an external magnetic field as supplied to the magnetoresistive elements is derived from the junction formed by the series-connected elements.

16 Claims, 49 Drawing Figures

FIG. 18III

MAGNETIC SIGNAL FIELD SENSOR THAT IS SUBSTANTIALLY IMMUNE TO ANGULAR DISPLACEMENT RELATIVE TO THE SIGNAL FIELD

BACKGROUND OF THE INVENTION

This invention relates to magnetic sensing apparatus for sensing an external magnetic field and, more particularly, to such apparatus which is formed of magnetoresistive elements and which is substantially insensitive to the particular direction in which the external magnetic field is supplied.

The use of magnetoresistive elements to detect a magnetic field is disclosed in U.S. Pat. Nos. 3,928,836, 4,053,829, and 4,079,360, all assigned to the assignee of the present invention. In these magnetic sensors, ferromagnetic material is deposited in serpentine configuration on an insulating substrate to form two series-connected magnetoresistive elements having respective main current conducting paths which are perpendicular to each other. If a saturating bias magnetic field is supplied to both magnetoresistive elements, a predetermined output signal is produced. In the presence of an external magnetic field, the resultant field through the magnetoresistive elements, that is, the vector sum of the bias and external magnetic fields, will result in a change in the predetermined output signal depending upon the angle formed between the main current conducting paths and the resultant magnetic field.

In the aforementioned patents, a mathematical relation is disclosed between the change in the predetermined output signal and the angular direction in which the external magnetic field is supplied. This expression is as follows:

$$V = \frac{V_o}{2} - \frac{\Delta\rho_o V_o}{4\rho_o} \cos 2\theta$$

wherein V is the output voltage produced by the magnetic sensor, $V_o$ is the predetermined output voltage produced as a function of the saturating bias fields, $\rho_o$ is the anisotropic resistance of the magnetoresistive elements and is proportional to the sum of the resistance thereof when a saturating magnetic field is supplied in parallel to the main current conducting path and the resistance thereof when the saturating field is supplied in a direction perpendicular to the main current conducting path ($2\rho_o = \rho_{11} + \rho_\perp$), and $\Delta\rho_o$ is equal to the difference between the resistance of the magnetoresistive element when the saturating field is supplied in a direction parallel to the main current conducting path and the resistance thereof when the saturating magnetic field is supplied in a direction perpendicular to the main current conducting path ($\Delta\rho_o = \rho_{11} - \rho_\perp$), and $\theta$ is the angle between a selected one of the main current conducting paths and the resultant magnetic field. In view of this equation, it is appreciated that, if the bias magnetic fields are of fixed intensity and are supplied in a predetermined direction, the angle $\theta$ varies in accordance with the angle in which the external magnetic field is supplied to the magnetic sensor.

While the magnetic sensor disclosed in the above-mentioned patents operates satisfactorily to detect the direction in which an external magnetic field is supplied, and also functions satisfactorily to detect the proximity of a magnetically permeable member (as disclosed in U.S. Pat. No. 4,021,728), there are some applications in which it is desirable to sense the intensity of the external magnetic field irrespective of the angle at which that external magnetic field is supplied. For example, there may be a need to detect the so-called zero point or zero position of a source of magnetic flux. That is, if the flux source is movable with respect to the magnetic sensor, an output signal should be produced when the flux source admits of a predetermined (e.g. zero) position. In some instances, the orientation of the magnetic sensor and/or flux source may not be uniform, thus resulting in a different angle between the magnetic field generated by the flux source and the magnetic sensor than may be expected. If this angle cannot be predicted or controlled, it is appreciated (from the foregoing equation) that the output signal produced by the magnetic sensor may exhibit a magnitude which is a function of this angle. Hence, because of this factor, the magnetic sensor may produce an output signal which represents that the flux source has reached its zero position even though, in fact, this zero position has not yet been attained. Similarly, when the flux source has, in fact, attained its zero position, the output signal produced by the magnetic sensor may differ from the zero-position output signal.

In view of the foregoing, it has been necessary heretofore to adhere to strict tolerances when assembling a magnetic sensor which is intended to sense the intensity of an external magnetic field. In zero point or zero position sensing applications of the type described above, these assembling tolerances are critical and, moreover, must be maintained throughout the useful life of the apparatus in which the magnetic sensor is used. This has resulted in increased costs of production.

OBJECTS OF THE INVENTION

Therefore, it is an object of the present invention to provide an improved magnetic sensor which is capable of sensing the intensity of an external magnetic field and which is substantially insensitive to the angle at which that external magnetic field is supplied.

Another object of this invention is to provide a magnetic sensor which produces an output signal representing the intensity of an external magnetic field irrespective of the orientation between the sensor and the field.

A further object of this invention is to provide a zero point or zero position detector which is adapted to sense the zero position of a source of external magnetic field, irrespective of the orientation between that source and the sensor.

An additional object of this invention is to provide an improved zero point or zero position magnetic sensor in which the zero position of a source of external magnetic field can be detected even if the magnetic sensor is rotated from a reference position in the presence of that external field.

Various other objects, advantages and features of the present invention will become readily apparent from the ensuing detailed description, and the novel features will be particularly pointed out in the appended claims.

SUMMARY OF THE INVENTION

In accordance with the present invention, apparatus for sensing an external magnetic field is provided, this apparatus including first and second coplanar magnetoresistive elements, each element having a main current conducting path and exhibiting anisotropic resistance as a function of the direction of the resultant magnetic field applied thereto. The first and second magnetoresistive elements are connected in series with each other and a d.c. current is adapted to be supplied thereto. First and second equal bias magnetic fields are supplied to the first and second magnetoresistive elements, respectively, these bias magnetic fields being supplied at respective angles relative to the respective main current conducting paths, which angles differ from each other. An output signal is derived from the junction defined by the series-connected magnetoresistive elements representative of the magnitude of an external magnetic field as supplied to those elements.

In accordance with one embodiment of this invention, the current conducting paths of the first and second magnetoresistive elements are perpendicular to each other; and the respective bias magnetic fields are opposite to each other and are aligned in parallel with one of the main current conducting paths. In accordance with another embodiment, the main current conducting paths are parallel to each other; and the respective bias magnetic fields are opposite to each other and are supplied at an angle, for example, ±45°, relative to these main current conducting paths. Such bias magnetic fields may be parallel to each other or, alternatively, may be perpendicular to each other.

In accordance with one advantageous feature, the magnetoresistive elements are spaced apart from each other so as to minimize hysteresis in the output signal.

BRIEF DESCRIPTION OF THE DRAWINGS

The following detailed description, given by way of example, will best be understood in conjunction with the accompanying drawings in which:

FIGS. 16B—16B-3 are schematic representations which are useful in understanding the operation of an alternative of the embodiment shown in FIG. 15B;

FIGS. 16C—16C-3 are schematic illustrations which are useful in understanding the operation of the embodiment shown in FIG. 15C;

DETAILED DESCRIPTION OF CERTAIN PREFERRED EMBODIMENTS

Figure 1:
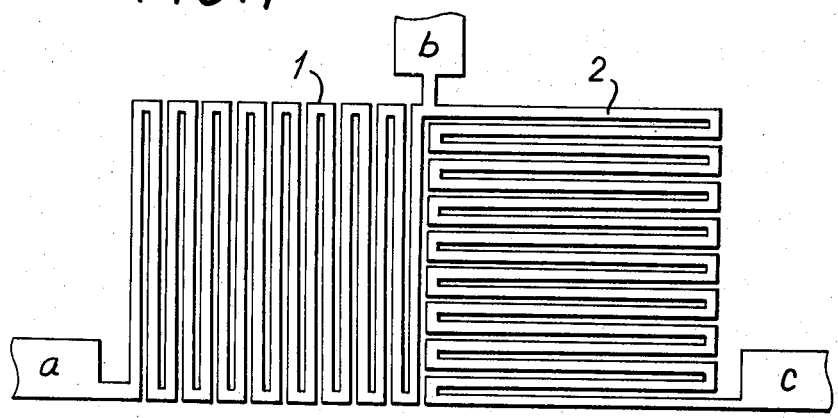
FIG. 1 is a schematic illustration of the magnetoresistive elements which are used in the magnetic sensor of the present invention.

Referring now to the drawings, wherein like reference numerals are used throughout, an example of a portion of the magnetic sensor in accordance with one embodiment of the present invention is illustrated in FIG. 1. A thin film of ferromagnetic material is deposited, as by a conventional vacuum evaporation technique, for example, on an insulating substrate to a depth of approximately 600 Å to 1000 Å. Typical examples of the substrate are a glass slide, a photographic dry plate, or the like. Other suitable materials can be used. Then, the thin film is etched so as to form the ferromagnetic strips 1 and 2 in zigzag or serpentine configuration, as shown, together with terminals a, b and c. The ferromagnetic strips 1 and 2 comprise respective main current conducting paths which are substantially perpendicular to each other. As viewed in FIG. 1, the strips 1 are capable of conducting current predominantly in the vertical direction and the strips 2 are capable of conducting current predominantly in the horizontal direction. Of course, as is realized, other mutually perpendicular current conducting directions can be employed.

Terminals a and c are used as d.c. current supply terminals whereby d.c. current, which may be furnished from any suitable d.c. current source, flows from terminal a, through strips 1, and then through strips 2 to terminal c. Thus, strips 1 and 2 are connected in series, and the junction defined by these series-connected strips is coupled to terminal b.

The ferromagnetic material which is used to form strips 1 and 2 exhibits anisotropic resistance. Thus, the resistance of strips 1 and 2 is a function of the direction in which a magnetic field is supplied thereto. As is known, the resistance of the ferromagnetic strips is a minimum when the magnetic field is supplied thereto in parallel with the current conducting path, and this resistance is a maximum when the magnetic field is supplied in a direction perpendicular to the current conducting path. Thus, if a magnetic field is supplied in the direction parallel to the current conducting path of strips 1, the resistance of strips 1 is at a minimum and the resistance of strips 2 is at a maximum. Conversely, if this magnetic field is supplied in a direction parallel to the current conducting path of strips 2, then the resistance of strips 1 now becomes a maximum and the resistance of strips 2 now becomes a minimum.

In the prior art use of the ferromagnetic strips of FIG. 1 in a magnetic sensor, strips 1 and 2 are supplied with a bias field. For example, in U.S. Pat. No. 4,079,360, the combination of these magnetic strips and the insulating substrate upon which such strips are mounted is, in turn, mounted on a bias magnet which supplies a bias field thereto in a direction that is parallel to one of the main current conducting paths. In the magnetic sensor described in U.S. Pat. No. 4,053,829, the bias field is supplied in a direction at, for example, 45° to both main current conducting paths. In both of these prior art embodiments, the bias field, represented herein as $H_B$, is supplied in the same direction to both strips.

As used in the present specification, the ferromagnetic strips deposited on the insulating substrate are referred to as magnetoresistive elements. In FIG. 1, ferromagnetic strips 1 are designated the first magnetoresistive element and ferromagnetic strips 2 are designated the second magnetoresistive element. With a bias field $H_B$ supplied in the same direction to both magnetoresistive elements, the output voltage derived from these magnetoresistive elements, that is, the output voltage derived from terminal b, is dependent upon the angle at which an external magnetic field is supplied. This phenomenon is described in detail in the aforementioned patents and, in the interest of brevity, will not be repeated herein. In some instances, it is desirable to detect the intensity of an external magnetic field irrespective of the direction in which that field is supplied to the magnetoresistive elements. The present invention allows such detection.

Figure 2:
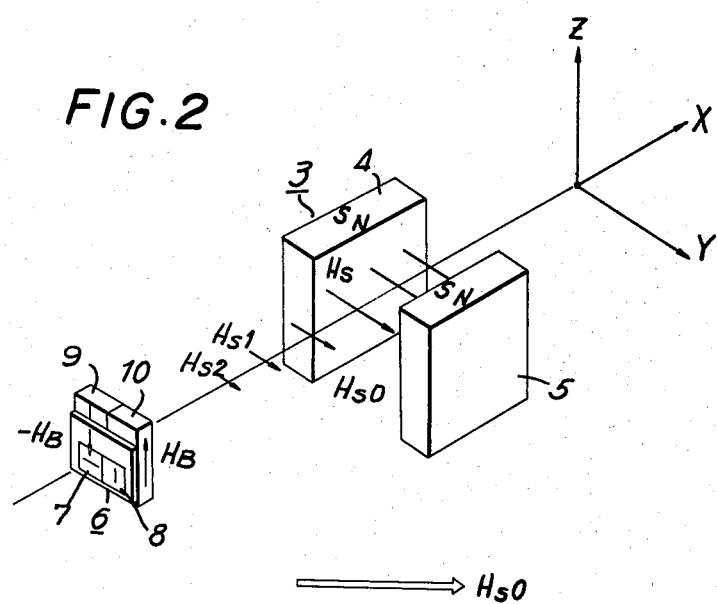
FIG. 2 is a perspective schematic view showing the application of one embodiment of the present invention.

Referring now to FIG. 2, let it be assumed that magnetoresistive elements 7 and 8 are provided on a substrate so as to form magnetic sensor 6. As illustrated, the main current conducting paths of these magnetoresistive elements are perpendicular to each other. A bias field $H_B$ is applied to each magnetoresistive element. Specifically, a bias magnet 9 supplies a bias field $-H_B$ to magnetoresistive element 7, and a bias magnet 10 supplies a bias field $H_B$ to magnetoresistive element 8. As illustrated in FIG. 2, and as is apparent from the plus and minus signs, these bias fields are supplied in opposite directions relative to each other. The substrate upon which magnetoresistive elements 7 and 8 are deposited can be mounted upon bias magnets 9 and 10 by conventional means. These bias magnets preferably supply bias fields which are sufficient to saturate the magnetoresistive elements and, as an example, each bias magnet may be formed of barium-ferrite.

Magnetic sensor 6 is adapted to sense the intensity of the external magnetic field, designated $H_s$ and sometimes referred to herein as the signal field, generated by a source 3 of magnetic flux. In the illustrated embodiment, flux source 3 is comprised of a pair of magnets 4 and 5 polarized in a direction such that the signal field $H_s$ is produced in a direction from magnet 4 to magnet 5. With reference to the xyz coordinates, the signal field $H_s$ is supplied in the y-direction; the bias fields $H_B$ are supplied in the z-direction; and the intensity of the signal fields $H_s$ varies in the x-direction. As for the latter point, it should be appreciated that, if magnetic sensor 6 is disposed at a great distance from flux source 3, the magnitude of the signal field $H_s$, as supplied to the magnetic sensor, is substantially equal to zero. The magnitude of this signal field, as sensed by the magnetic sensor, increases as the magnetic sensor is moved along the x-axis toward flux source 3. The arrows shown in FIG. 2 which represent the signal field $H_s$ are seen to increase in size as flux source 3 is approached, thus indicating that the intensity of this signal field likewise increases as a function of the distance from the source.

It is one advantageous feature of the present invention that the output signal produced by magnetic sensor 6 is not greatly influenced by the direction in which the signal field $H_s$ is supplied to the magnetic sensor. This is due to the fact that the bias fields are supplied to magnetoresistive elements 7 and 8 in opposite directions. Specifically, when the magnetoresistive element is at a particular position relative to flux source 3 such that the intensity $H_{so}$ of the signal field which is supplied to the magnetic sensor is equal to the intensity of the bias field $H_B$, the output signal derived from the magnetic sensor will be substantially constant even if the signal field or the magnetic sensor is rotated about the x-axis. This means that, irrespective of the orientation of magnetic sensor 6 relative to the signal field $H_{so}$, there will be no change in the output signal which is produced in response to that signal field. Hence, the intensity of this signal field, and thus the position of flux source 3, can be detected regardless of the angular relation between the magnetic sensor and the signal field. This means that if the magnetic sensor is used in conjunction with other apparatus, it may be readily assembled without adhering to strict tolerances, thus reducing the cost of manufacture.

Figure 3A:
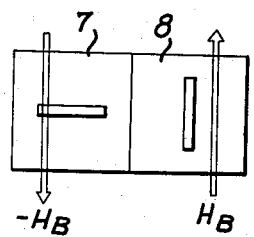
FIGS. 3A-3C are schematic illustrations which are helpful in understanding the present invention.
Figure 3B:
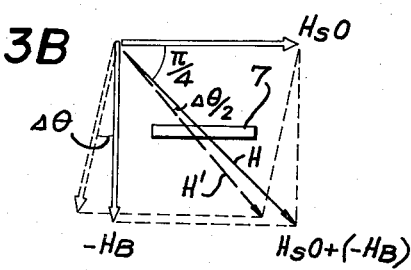
Figure 3C:
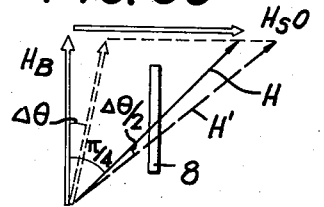

In the example shown in FIG. 2, let it be assumed that the signal field $H_s$ produced by flux source 3 in the vicinity between magnets 4 and 5 is on the order of 800 to 900 gauss. Let it be further assumed that the bias magnetic field $H_B$ (or $-H_B$) produced by each of the bias magnets is on the order of 200 to 300 gauss. The intensity of the bias field is sufficient to saturate magnetoresistive elements 7 and 8. Depending upon the distance between magnetic sensor 6 and flux source 3, the intensity of the signal field $H_s$ as supplied to the magnetic sensor will be between zero and 800–900 gauss. Referring to FIGS. 3A–3C, let it be assumed that magnetic sensor 6 is disposed at a location spaced from flux source 3 such that the intensity of the signal field supplied to the magnetic sensor is equal to $H_{so}$, and that this intensity is equal to the intensity of the bias field $H_B$. The relationship between the main current conducting paths of magnetoresistive elements 7 and 8, the direction and intensity of the signal field $H_{so}$ supplied to these magnetoresistive elements, and the direction and intensity of the bias fields $+H_B$ and $-H_B$ is as shown in FIG. 3A.

As is appreciated, the resultant field H supplied to each of magnetoresistive elements 7 and 8 is the vector summation of the bias and signal fields. Since the bias and signal fields are assumed herein to be equal, FIG. 3B represents that the resultant field H through magnetoresistive element 7 defines an angle of $\pi/4$ with respect to the signal field and also, in the example assumed herein, with respect to the main current conducting path of this element. Similarly, FIG. 3C represents that the resultant field H through magnetoresistive element 8 forms an angle $\pi/4$ with respect to the bias field $+H_B$, and in the example assumed herein, an angle of $\pi/4$ with respect to the main current conducting path of magnetoresistive element 8. Let it be assumed that, instead of being oriented such that the bias fields both are perpendicular to the signal field, magnetic sensor 6 had been rotated by the angle $\Delta\theta$ about the x-axis, as represented by the broken lines in FIGS. 3B and 3C. Of course, with this rotation, or angular displacement, of the magnetic sensor, the signal field $H_{so}$ no longer will be parallel to magnetoresistive element 7, nor will this signal field be perpendicular to magnetoresistive element 8. Rather, an angle $\Delta\theta$ will be formed between the signal field $H_{so}$ and element 7; and the angle $(90° - \Delta\theta)$ will be formed between the signal field and element 8. Furthermore, the resultant field $H'$ which now is supplied to magnetoresistive element 7 will be shifted by the amount $\Delta\theta/2$, as shown by the broken lines in FIG. 3B. Similarly, the resultant field $H'$ supplied through magnetoresistive element 8 will be shifted by $\Delta\theta/2$, as shown by the broken lines in FIG. 3C. It is seen that the intensity of the resultant field $H'$ through element 7 now is less than the intensity of the resultant field $H'$ through element 8. Nevertheless, the respective fields $H'$ through both elements are of a sufficient intensity so as to saturate these elements and, thus, the actual magnitude of the field $H'$ has substantially no effect upon the output signal derived from the magnetic sensor. However, it is seen that the resultant field $H'$ through magnetoresistive element 7 is shifted by the amount $\Delta\theta/2$ more toward the perpendicular direction. Similarly, the resultant field $H'$ through magnetoresistive element 8 is shifted by the amount $\Delta\theta/2$ more toward the perpendicular direction. The angular displacements of the respective resultant fields are equal to each other. In the example assumed by the broken lines in FIGS. 3B and 3C, since the resultant fields $H'$ are angularly displaced relative to the main current conducting paths of magnetoresistive elements 7 and 8 toward the perpendicular direction, the resistance of each element is reduced, and these reductions are equal. Hence, since these changes in the respective resistances are equal, there is no change in the output voltage derived from the magnetic sensor even though the magnetic sensor has been angularly displaced about the x-axis.

From the foregoing, it should be appreciated that, when the bias field $H_B$ is supplied to magnetoresistive elements 7 and 8 in opposite directions, then even though the magnetic sensor may be rotated relative to the signal field $H_s$, the change in the angle of the resultant field $H'$ through magnetoresistive element 7 is equal to the change in the angle of the resultant field $H'$ through magnetoresistive element 8. These equal changes result in equal changes in the resistances of the respective elements. Consequently, even though there is an angular displacement, and even though the angle of the signal field supplied to the magnetoresistive elements changes, the output signal derived from the magnetic sensor remains fixed. In the specific example wherein magnetic sensor 6 is disposed from flux source 3 at a distance such that the intensity of the signal field $H_{so}$ is equal to the intensity of the bias field $H_B$, a stable zero point or zero position detector is provided.

Figure 4A:
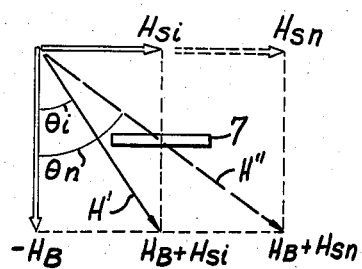
FIGS. 4A and 4B are further schematic illustrations which are helpful in understanding this invention.
Figure 4B:
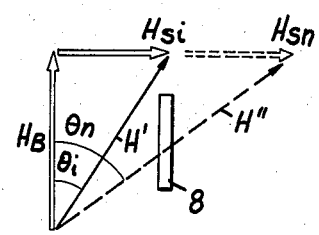
Figure 16A:
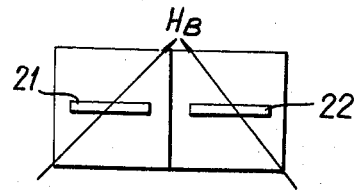
FIGS. 16A—16A-3 are schematic representations which are useful in understanding the embodiment shown in, for example, FIG. 15B.
Figures 1, 16A:
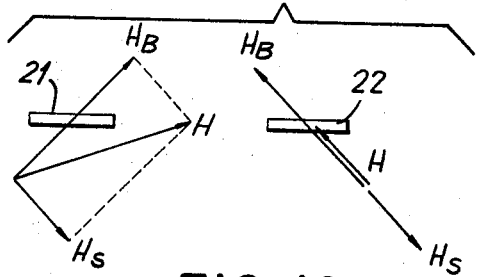
Figures 2, 16A:
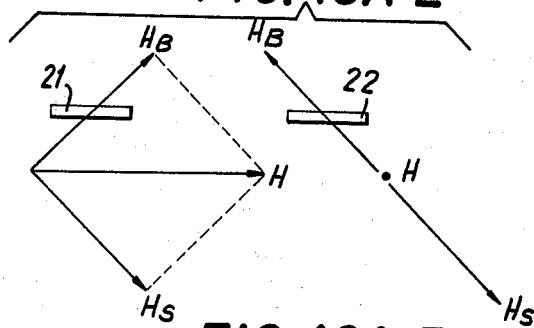
Figures 3, 16A:
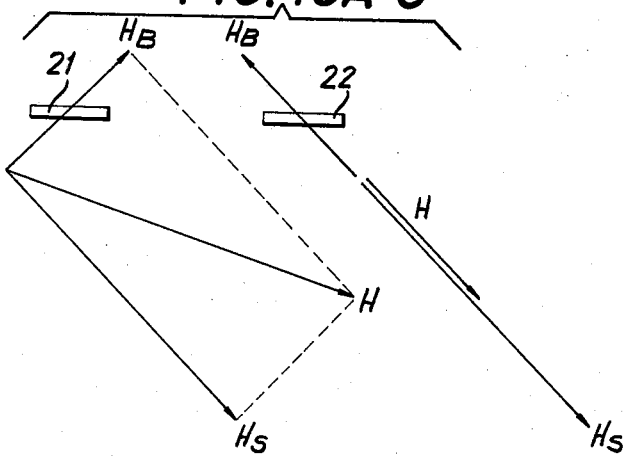

Although the embodiment shown in FIGS. 2 and 3 produces an output signal which is substantially insensitive to the direction in which the signal field is supplied to the magnetoresistive elements, particularly when the intensity of the signal field is equal to the intensity of the bias field, the illustrated magnetic sensor is responsive to changes in the intensity of the supplied signal field. Let it be assumed that magnetic sensor 6 moves in the $+x$ direction relative to flux source 3 such that the intensity of the signal field $H_s$ varies from, for example $H_{si}$ to $H_{sn}$, as a function of the x position of the magnetic sensor. Referring to FIGS. 4A and 4B, it is seen that when the intensity of the signal field is equal to $H_{si}$, the resultant field $H'$ formed by the vector addition of the signal field and bias field $-H_B$, through magnetoresistive element 7 is at an angle $\theta_i$ relative to the bias field direction. Similarly, the resultant field $H'$ through magneto resistive element 8 is at an angle $\theta_i$ relative to the direction of the bias field. Now, if the intensity of the signal field is increased to, for example $H_{sn}$, the resultant field $H''$ through magnetoresistive element 7 now forms an angle $\theta_n$; and, similarly, the resultant field $H''$ through magnetoresistive element 8 now forms the increased angle $\theta_n$. The angle that the resultant field forms with respect to the main current conducting path of magnetoresistive element 7 decreases as the intensity of the signal field increases. Conversely, the angle formed between the resultant field $H''$ and the main current conducting path of magnetoresistive element 8 increases as the intensity of the signal field increases. This means that the resistance of element 7 increases while the resistance of element 8 decreases as the intensity of the signal field increases. Of course, when the signal field intensity is equal to zero, the resultant field through each magnetoresistive element is equal solely to the bias field which, for magnetoresistive element 7, is perpendicular to the main current conducting path, and for magnetoresistive element 8 is parallel thereto. Of course, the increasing resistance of magnetoresistive element 7, taken in conjunction with the decreasing resistance of magnetoresistive element 8 as the signal field intensity increases results in a change in output signal derived from magnetic sensor 6. This is because the resistances of the respective magnetoresistive elements change in opposite directions (i.e., one resistance increases while the other decreases). It should be recognized that this change in the resistances is contrary to the phenomenon which occurs when only the direction in which the signal field is supplied is changed while maintaining a constant signal field intensity. In this latter condition, the resistances of the respective magnetoresistive elements change by the same amount in the same direction (i.e., both increase or both decrease).

Figure 5:
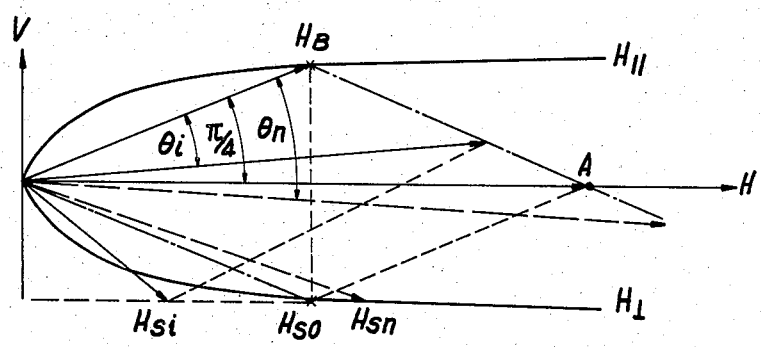
FIG. 5 is a graphical representation showing the relationship between the output voltage produced by the magnetic sensor in response to the magnetic fields supplied thereto.

The relationship between the output signal, which is produced as an output voltage V, derived from magnetic sensor 7 and the intensity of the resultant field H supplied to the magnetic sensor is graphically depicted in FIG. 5. The reference $H_{||}$ refers to a magnetic field which is parallel to the main current conducting path of a magnetoresistive element, and the reference $H\perp$ refers to a magnetic field which is perpendicular to the main current conducting path. It is assumed that the bias field $H_B$ remains constant and is of an intensity which is sufficient to saturate the magnetoresistive elements. As illustrated in this graph, which may be representative of magnetoresistive element 8, the bias field $H_B$ is supplied in parallel to the main current conducting path, and the signal field $H_s$ is supplied in a perpendicular direction thereto. When the bias and signal fields are equal, that is, when the signal field exhibits an intensity $H_{so}$, the resultant field H through the magnetoresistive element has the intensity represented at point A and forms the angle $\pi/4$ with the main current conducting path. In FIG. 5, it should be appreciated that this angle merely is identified as being equal to $\pi/4$ but is not drawn to scale. Furthermore, at point A, that is, when the intensity of the signal field is equal to the intensity of the bias field, the output voltage V is equal to a reference voltage which, in the graphical representation, is equal to zero. As the intensity of the signal field changes (from, for example, an intensity $H_{si}$ to an intensity $H_{sn}$), the output voltage V derived from magnetic sensor 6 likewise changes.

In general, when ferromagnetic material is disposed in a magnetic field, hysteresis can be observed when the intensity of the field is reduced to a low level. The magnetic sensor of the present invention is not completely free from this hysteresis phenomenon. Hence, unless the intensity of the resultant field which passes through each magnetoresistive element is maintained at a relatively high level, the output voltage derived from the magnetic sensor will be subject to some hysteresis. Accordingly, if the magnetic sensor is used as a position detector, a hysteresis error will be introduced into the position signal which is derived therefrom.

Figure 6:
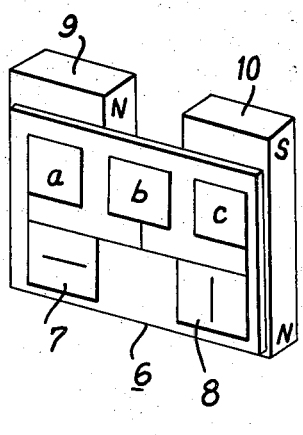
FIG. 6 is a perspective schematic view of another embodiment of the present invention.
Figure 7:
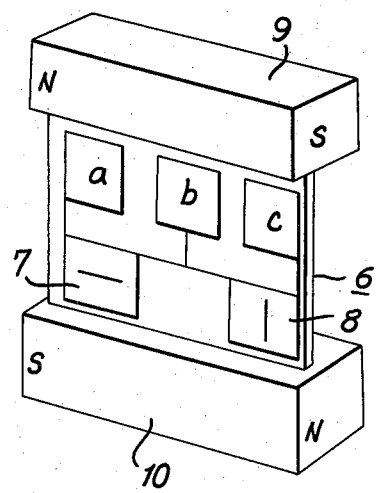
FIG. 7 is a perspective schematic view of still another embodiment of the present invention.

The hysteresis effect can be reduced if a saturating magnetic field is supplied to the magnetoresistive elements. In general, the elements will be saturated if the bias fields supplied thereto have an intensity on the order of about 200 oersteds or more. However, it may not be convenient to supply bias fields of this intensity. If bias magnets 9 and 10 (FIG. 2) are formed of barium ferrite, the bias fields produced thereby may not be sufficient to reduce the influence of hysteresis to a negligible amount. Consequently, in accordance with another embodiment of the present invention, magnetoresistive elements 7 and 8 are spaced apart from each other. In the embodiment shown in FIG. 6, bias magnets 9 and 10 likewise are spaced apart, and magnetoresistive elements 7 and 8 are separated by about 3 to 4 millimeters. In another embodiment, shown in FIG. 7, bias magnets 9 and 10 are disposed along opposite edges of the substrate upon which magnetoresistive elements 7 and 8 are deposited, and these elements are separated by about 3 to 4 millimeters. By separating the magnetoresistive elements, and also the bias magnets, the bias fields which are supplied to the magnetoresistive elements will minimize the effect of hysteresis.

Figure 8I:
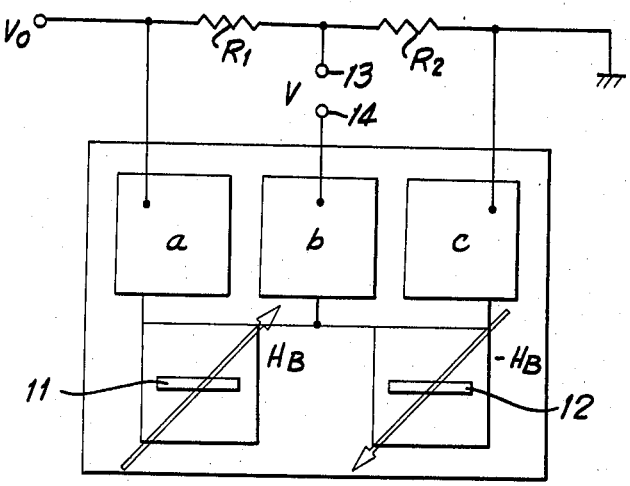
FIGS. 8(i)-8(ii) are schematic illustrations of a still further embodiment of this invention.
Figure 8:
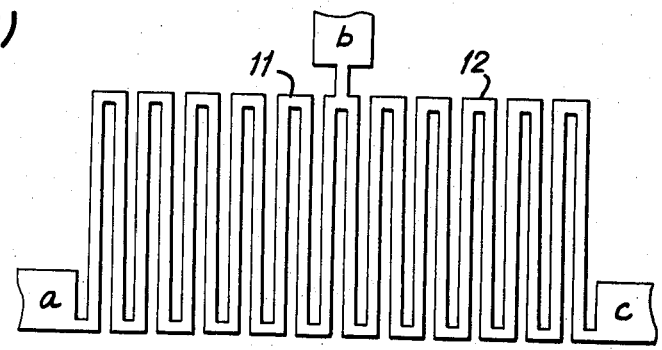

In the examples described above, the main current conducting paths of magnetoresistive elements 7 and 8 are perpendicular to each other, and the bias fields are parallel to one of these paths and are, of course, opposite to each other. Another embodiment of the present invention is illustrated in FIGS. 8(i) and 8(ii). In this embodiment, the magnetoresistive elements are identified by reference numerals 11 and 12 and, as is illustrated in FIG. 8(ii), the main current conducting paths of elements 11 and 12 are parallel to each other. Bias fields $+H_B$ and $-H_B$ are opposite to each other, but now extend at a predetermined angle with respect to the main current conducting paths of magnetoresistive elements 11 and 12. As one example, bias field $+H_B$ forms an angle $+45°$ with respect to magnetoresistive element 11, and bias field $-H_B$ forms an angle of $-135°$ with respect to magnetoresistive element 12. In the schematic illustration of FIG. 8(i), a pair of series-connected resistors $R_1$ and $R_2$ is connected across d.c. current supply terminals a and c. If output terminals 13 and 14 are connected to the respective junctions defined by series-connected resistors $R_1$ and $R_2$ and defined by the series-connected magnetoresistive elements (i.e., to terminal b), the output voltage V can be set at a predetermined value, such as zero, when the signal field $H_s$ has an intensity equal to zero, by properly dimensioning the resistors. Also, by providing resistors $R_1$ and $R_2$, differences in resistances of magnetoresistive elements 11 and 12 in response to bias fields $+H_B$ and $-H_B$ can be compensated.

Figure 9A:
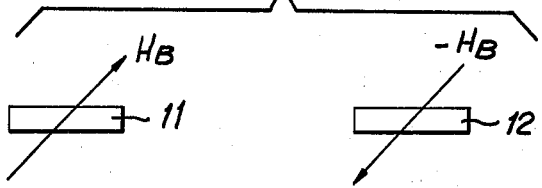
FIGS. 9A-9D are schematic representations which are useful in understanding the operation of the embodiment shown in FIG. 8(i)
Figure 9B:
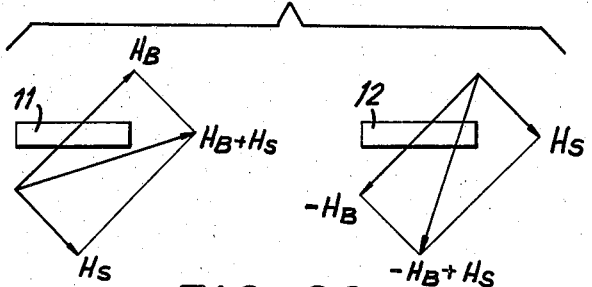

Referring now to FIGS. 9A–9D, it is assumed that the bias fields are supplied at an angle of 45° with respect to the main current conducting paths of magnetoresistive elements 11 and 12, and in opposite directions, as represented in FIG. 9A. Let it be assumed that a signal field $H_s$ having an intensity less than the bias field intensity is supplied in a direction perpendicular to the direction of the bias field, as shown in FIG. 9B. The resultant field through magnetoresistive element 11, formed by the vector summation of the signal and bias fields, is at an angle less than 45° with respect to the main current conducting path of magnetoresistive element 11. However, the resultant field through magnetoresistive element 12 forms an angle which is greater than 45° with respect to the main current conducting path, that is, it is closer to the perpendicular direction. Hence, the resistance of magnetoresistive element 11 increases while the resistance of magnetoresistive element 12 decreases. In the circuit shown in FIG. 8(i), the output voltage V at output terminals 13 and 14 is a negative voltage under these conditions.

Figure 9C:
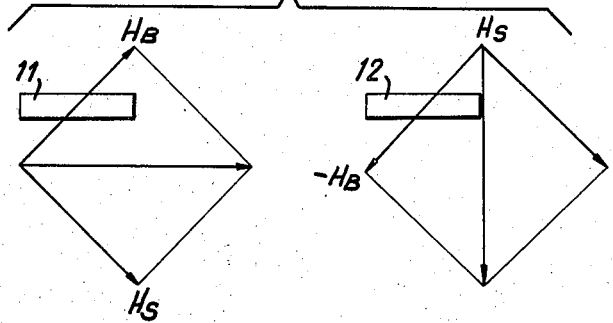

Let it now be assumed that the intensity of the signal field $H_s$ is equal to the intensity of the bias field, as shown in FIG. 9C. Hence, the resultant field through magnetoresistive element 11 now is parallel to the main current conducting path thereof; and the resultant field through magnetoresistive element 12 now is perpendicular to the main current conducting path thereof. This means that the resistance of element 11 has been increased to its maximum value and the resistance of element 12 has been reduced to its minimum value. The output voltage V across output terminals 13 and 14 now is at its maximum negative level.

Figure 9D:
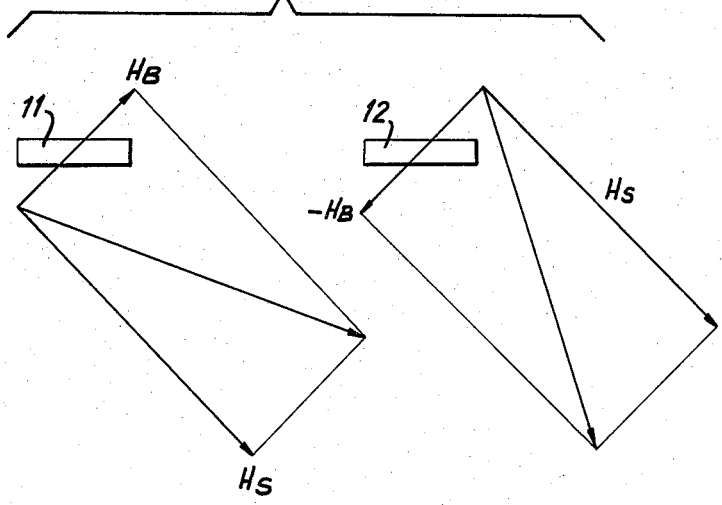

As the intensity of the signal field continues to increase, the resultant fields through magnetoresistive elements 11 and 12 are as shown in FIG. 9D. It is seen that, for both elements, the resultant field now tends to form an angle which approaches the angle between the signal field $H_s$ and the main current conducting path. Since the signal field is supplied at the same angle relative to the main current conducting paths of the respective elements, the angle between the resultant field and each magnetoresistive element approaches an equal angle, whereby the resistances of these elements become equal to each other. At equal resistances, the output voltage V across output terminals 13 and 14 approaches zero.

Figure 11:
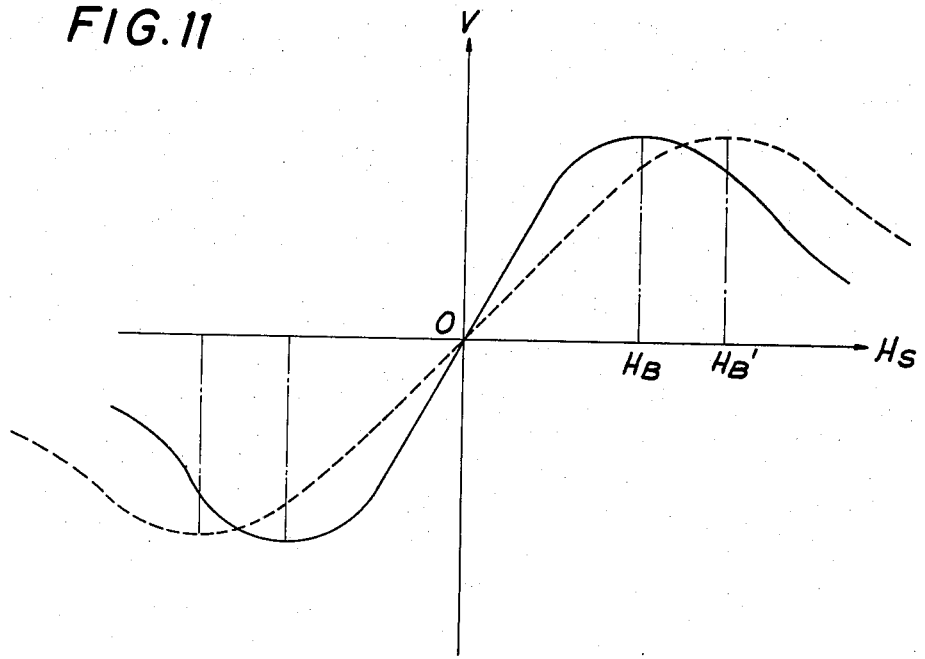
FIG. 11 is a graphical representation of the relationship between the output voltage produced by the embodiment shown in FIG. 8(i) in response to an externally supplied magnetic field.

The relationship between the output voltage V produced across output terminals 13 and 14 and the circuit shown in FIG. 8(i) and the signal field $H_s$, as discussed with reference to FIGS. 9A–9D, is graphically represented by the solid curve shown in FIG. 11. For convenience, this curve is inverted so as to show a maximum positive level (rather than the aforementioned maximum negative level) in the output voltage when the signal field intensity is equal to the bias field intensity. If the intensity of the bias field $H_B$ (and $-H_B$) is increased to, for example, $H'_B$, the solid curve in FIG. 11 would appear as the broken curve illustrated therein. Hence, it is appreciated that the sensitivity of the magnetic sensor shown in FIG. 8 is determined by the intensity of the bias field applied thereto.

If the direction in which the signal field $H_s$ supplied to the magnetoresistive elements is opposite to that shown in FIGS. 9B–9D, the output voltage V will be similar to that described above, but its polarity will be inverted. That is, for the example of FIG. 9C, instead of exhibiting a maximum negative voltage, output voltage V will be a maximum positive voltage.

Figure 10A:
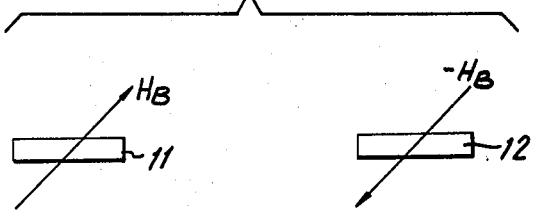
FIGS. 10A-10D are schematic illustrations which are useful in understanding the operation of the embodiment shown in FIG. 8(i)
Figure 10B:
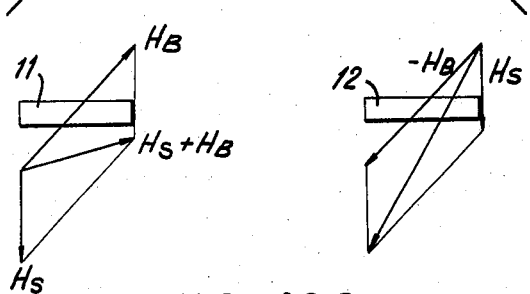
Figure 10C:
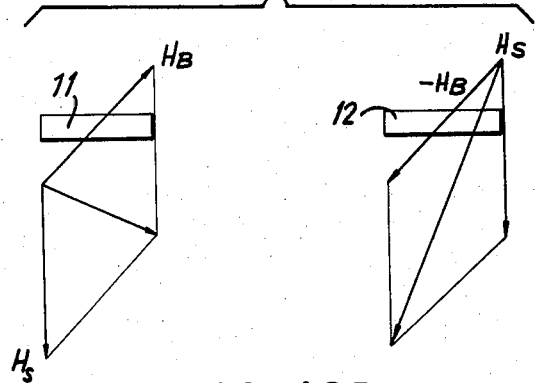
Figure 10D:
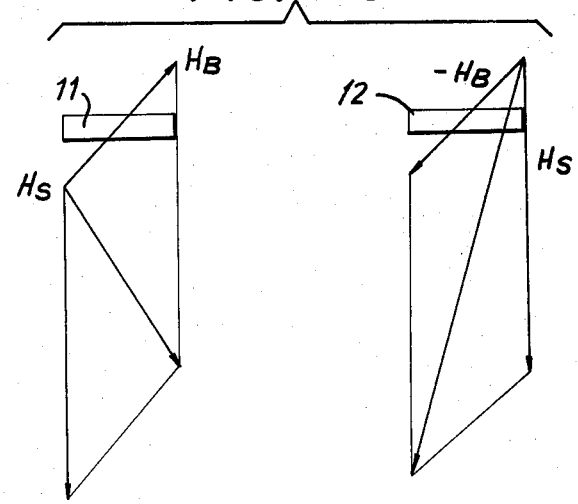

FIGS. 10B–10D are similar to FIGS. 9B–9D, except that the signal field $H_S$ is supplied in a direction which is perpendicular to the main current conducting paths of magnetoresistive elements 11 and 12. In the FIG. 10 illustrations, the signal field direction no longer is perpendicular to the bias field direction. In the absence of a signal field, as represented by FIG. 10A, the resistances of magnetoresistive elements 11 and 12 are equal to each other, and the output voltage V is, therefore, equal to zero. When a signal field $H_s$ having an intensity that is less than the bias field intensity is supplied in the illustrated direction, the resultant field through magnetoresistive element 11 is almost parallel to the main current conducting path thereof, thus resulting in a maximum resistance. The resultant field through magnetoresistive element 12 exhibits an angle that is between 45° and 90° with respect to the main current conducting path thereof, thereby reducing the resistance of magnetoresistive element 12. Accordingly, the output voltage V produced across output terminals 13 and 14 for the condition shown in FIG. 10B is a negative voltage.

FIG. 10C represents the resultant field through magnetoresistive elements 11 and 12, respectively, when the intensity of the signal field is equal to the intensity of the bias field. It is recognized that, as the signal field intensity increases from the condition shown in FIG. 10B to the condition shown in FIG. 10C, the resistance of magnetoresistive element 11 will increase to a maximum level and then will decrease. At the same time, the resistance of magnetoresistive element 12 will continue to decrease. Of course, as the intensity of the signal field continues to increase, as represented by FIG. 10D, the resultant field through each magnetoresistive element forms an angle with respect to the main current conducting path which asymptotically approaches 90°. At some signal field intensity between the conditions represented by FIGS. 10B and 10D, the output voltage V across output terminals 13 and 14 will reach its maximum negative level and then will return asymptotically toward a zero level. Thus, when the signal field is supplied in the direction represented by FIGS. 10B–10D, the relationship between the output voltage V and the intensity of this signal field will differ from the graphical representation shown in FIG. 11. Although the output voltage here is affected by the direction in which the signal field is supplied, as is appreciated from a comparison of the descriptions of the operation represented by FIGS. 9 and 10, if the signal field intensity is small relative to the bias field intensity, such as in the vicinity of the zero signal field point, the relationship between the output voltage and the signal field is substantially the same. That is, the graphical representation of FIG. 11 for small signal field intensities is applicable to the conditions represented by FIGS. 9A, 9B and by 10A, 10B.

Figure 12:
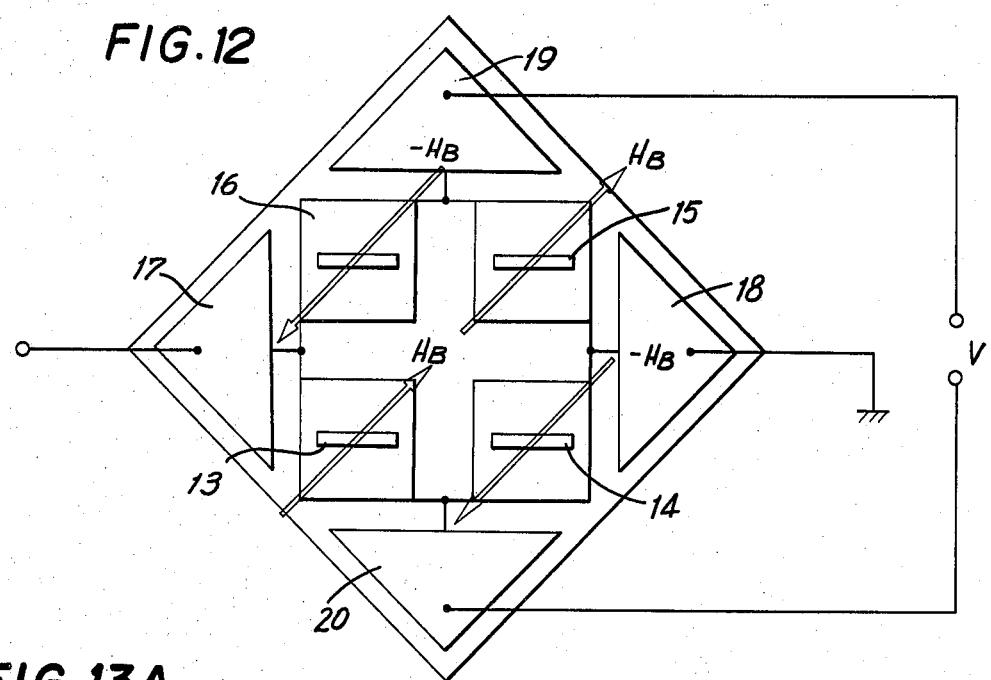
FIG. 12 is a schematic representation of a still further embodiment which utilizes the teachings of the present invention.

The embodiment illustrated in FIG. 8 can be connected in a bridge configuration comprised of four magnetoresistive elements, as shown in FIG. 12. In this bridge configuration, series-connected magnetoresistive elements 13 and 14 have their current supply terminals a and c connected to junctions 17 and 18. An additional pair of series-connected magnetoresistive elements 15 and 16 have their current supply terminals also connected to junctions 17 and 18. The junction defined by series-connected elements 13 and 14 is coupled to an output terminal 20 and, similarly, the junction defined by series-connected elements 15 and 16 is coupled to an output terminal 19. An output voltage V is provided across output terminals 19 and 20.

As in the aforedescribed embodiment, equal but opposite bias fields $+H_B$ and $-H_B$ are supplied to magnetoresistive elements 13 and 14 at a predetermined angle, such as 45°, with respect to the main current conducting path thereof. Similarly, equal but opposite bias fields $+H_B$ and $-H_B$ are supplied at predetermined angles, such as 45°, with respect to the main current conducting paths of magnetoresistive elements 15 and 16. In the illustrated bridge configuration, elements 13 and 15 may be considered to be one pair of opposite bridge arms, and elements 14 and 16 may be considered to be another pair of opposite bridge arms. The bias field $H_B$ through the magnetoresistive elements in a respective pair of bridge arms is in the same direction, and is opposite to the direction of the bias field through the other pair of bridge arms. Suitable bias magnets (not shown) may be secured to the respective magnetoresistive elements so as to supply the illustrated bias fields in the indicated directions.

The operation of the magnetoresistive elements connected in the illustrated bridge configuration in response to a supplied signal magnetic field is similar to the operation discussed with reference to FIG. 9 and also with reference to FIG. 10. It should be appreciated that, in this bridge configuration, the output voltage V is increased for a signal field of given intensity. Furthermore, when connected in this bridge configuration, the magnetic sensor has improved temperature stability.

It is preferred that the signal field $H_s$ be supplied to the magnetoresistive elements of the embodiments shown in FIGS. 8 and 12 so as to be perpendicular to the direction of the bias fields. That is, operation in accordance with the conditions discussed with respect to FIG. 9 is preferred. This results in symmetrical output voltage characteristics and a relatively stable temperature characteristic of the output voltage. More particularly, if the signal field is supplied in a direction perpendicular to the bias field, that is, if the signal field is supplied at an angle of about 45° with respect to the main current conducting path of the respective magnetoresistive elements, the temperature coefficient of the magnetic sensor in the vicinity of the zero point is substantially zero.

Let it be assumed that magnetoresistive elements 1 and 2, of the type shown in FIG. 1, are supplied with bias fields $H_B$ which extend in the same direction to each other. That is, let it be assumed that the feature of the present invention wherein the bias fields are opposite to each other is not incorporated. Let it be further assumed that the bias field, which is common to both magnetoresistive elements, is at an angle of 45° with respect to each main current conducting path. Finally, it is additionally assumed that series-connected resistors $R_A$ and $R_B$ are connected across the d.c. current supply terminals, as illustrated in FIG. 13. In this configuration, if the signal field $H_s$ is supplied in a direction perpendicular to the bias field, that is, if the signal field is supplied at an angle of 45° with respect to the main current conducting path of each element, the relationship between the output voltage V and the intensity of the signal field $H_s$ is as represented by the graph of FIG. 14A.

Figure 13A:
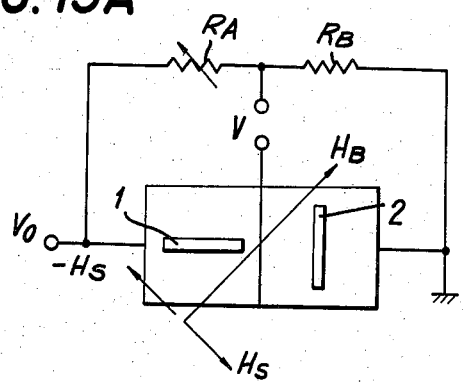
FIGS. 13A-13B are schematic representations of magnetic sensors in accordance with known prior art embodiments.
Figure 14:
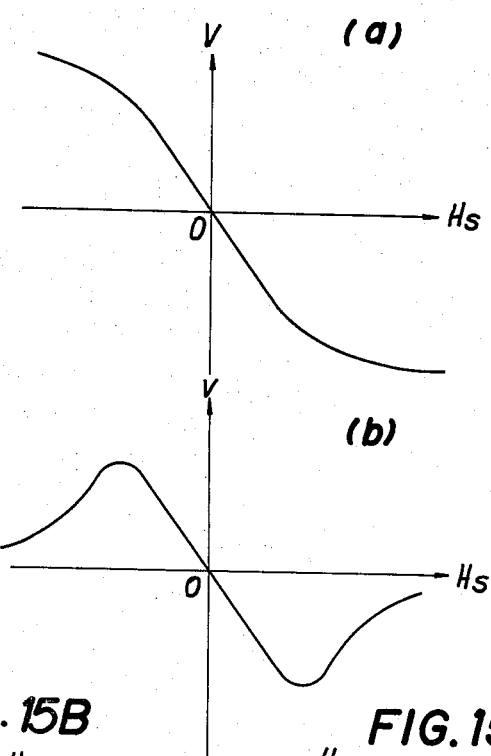
FIGS. 14A-14B are graphical representations of the outputs produced by the embodiments shown in FIGS. 13A-13B.
Figure 13B:
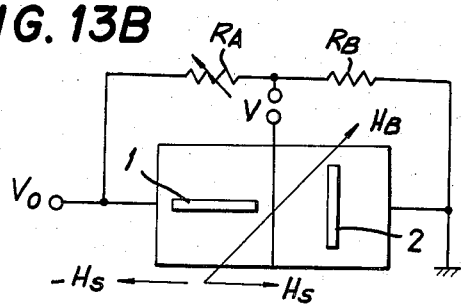

If the signal field $H_s$ is supplied in a direction parallel to, for example, the main current conducting path of magnetoresistive element 1, as represented by FIG. 13B, the relationship between the output voltage V and the signal field intensity is as graphically depicted in FIG. 14B. It should be appreciated that, in the examples of FIGS. 13A and 13B, the output voltage V is varied if the bias field or main current conducting paths of the magnetoresistive elements vary by the angular displacement $\Delta\theta$. That is, in these magnetic sensors, the output voltage is not immune to such angular displacements. Thus, the devices of FIGS. 13A and 13B do not exhibit the advantageous features of the present invention.

Figure 15A:
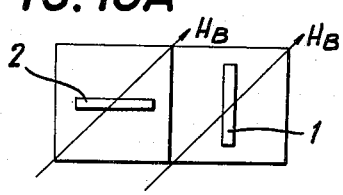
FIGS. 15A-15C are schematic illustrations which represent embodiments of the present invention as compared to known embodiments of a magnetic sensor.

FIG. 15A corresponds to the magnetic sensor shown in FIGS. 13A and 13B. Let it be assumed that, for example, magnetoresistive element 1, together with its bias magnet, as shown in FIG. 15A, is rotated by $+90°$, resulting in the configuration shown in FIG. 15B. In this configuration, the main current conducting paths of magnetoresistive elements 1 and 2 extend in the same direction, and the bias field $H_B$ is supplied to magnetoresistive element 1 at an angle which differs from the angle at which bias field $H_B$ is supplied to magnetoresistive element 2. If, in FIG. 15A, magnetoresistive element 1, together with its bias magnet, had been rotated by $-90°$, the resultant configuration would be as shown in FIG. 15C. Here too, the bias field $H_B$ which is supplied to magnetoresistive element 1 exhibits an angle with respect to the main current conducting path thereof which differs from the angle at which the bias field $H_B$ is supplied to magnetoresistive element 2.

Figure 15B:
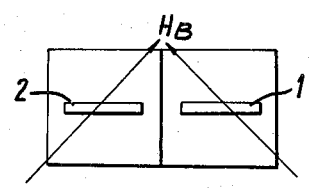
Figure 15C:
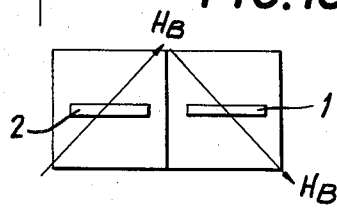

The embodiment shown in FIG. 15B exhibits the advantageous feature of the present invention wherein the output voltage derived from the magnetic sensor is substantially immune to angular displacements thereof relative to the signal field. This will be described with reference to the conditions shown in FIG. 16A, wherein the magnetoresistive elements are identified by reference numerals 21 and 22. Let it be assumed that, wherein the bias fields $H_B$ for magnetoresistive elements 21 and 22 are perpendicular to each other and exhibit angles of $+45°$ and $+135°$, respectively, a signal field $H_s$ having an intensity less than the bias field intensity is supplied in the direction as shown. That is, the signal field is perpendicular to the bias field which is supplied to magnetoresistive element 21. In accordance with this condition, the resultant field H through magnetoresistive element 21 is at an angle of less than 45° with respect to the main current conducting path therethrough. Hence, the resistance of magnetoresistive element 21 is increased. With respect to magnetoresistive element 22, it is seen that the signal field is opposite to the bias field $H_B$ therethrough. Hence, the resultant field H, although reduced in intensity from the bias field intensity, is at an angle of 135° with respect to the main current conducting path of magnetoresistive element 22. Accordingly, there is no change in the resistance of this element. Since the resistance of element 21 increases, the output voltage derived from the magnetic sensor shown in FIG. 16A is increased in the negative direction.

Now, if the intensity of the signal field $H_s$ is further increased so as to be equal to the bias field intensity, as shown in FIG. 16A-2, the resultant field H through magnetoresistive element 21 is parallel to the main current conducting path thereof. With respect to magnetoresistive element 22, the signal field intensity is equal and opposite to the bias field intensity. Hence, the resistance of magnetoresistive element 21 is increased to its maximum value, while the resistance of magnetoresistive element 22 is not varied. Consequently, the output voltage derived from the magnetic sensor is increased to its maximum negative level.

As the signal field $H_s$ increases in intensity, as shown in FIG. 16A-3, the angle formed between the resultant field H through magnetoresistive element 21 and the main current conducting path thereof increases, asymptotically, toward $-45°$. The resultant field H through magnetoresistive element 22 increases in intensity, but remains at the constant angle of 45° with respect to the main current conducting path thereof. Hence, the value of the resistance of magnetoresistive element 21 asymptotically approaches the value of the resistance of magnetoresistive element 22. When these two resistances are of equal value, the output voltage produced by the magnetic sensor is equal to zero. Thus, as the intensity of the signal field $H_s$ increases, the output voltage derived from the magnetic sensor asymptotically approaches zero.

If the direction of the signal field $H_s$ is opposite to that illustrated in FIGS. 16A-1 to 16A-3, the output voltage V derived from the magnetic sensor will increase in the positive direction from a magnitude of zero when only the bias fields are supplied, to a maximum voltage level when the signal field intensity is equal to the bias field intensity, and then will asymptotically approach zero as the signal field intensity continues to increase.

Figure 16B:
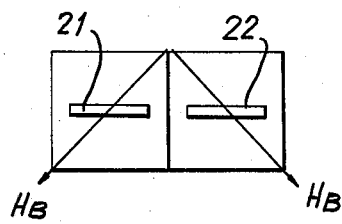
Figures 1, 16B:
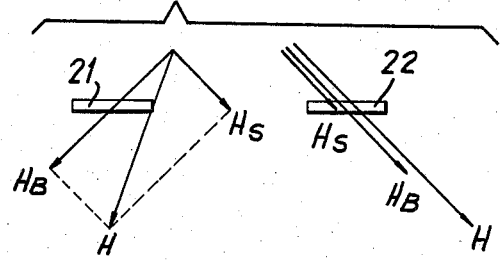
Figures 2, 16B:
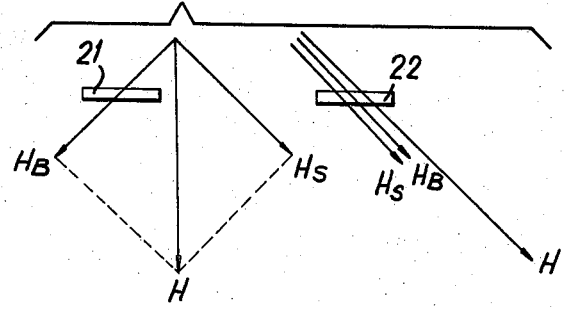
Figures 3, 16B:
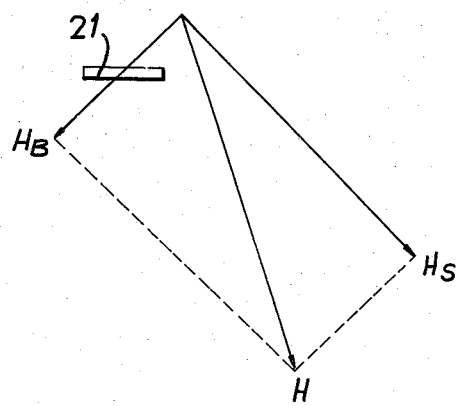

If it is assumed that the directions of the bias fields shown in FIG. 15B are reversed, such as shown in FIG. 16B, the resultant field through magnetoresistive elements 21 and 22 in response to the application of a signal field $H_s$ thereto is as shown in FIGS. 16B-1 to 16B-3. The output voltage increases in the positive direction from a zero level when the signal field $H_s$ has an intensity of zero, and reaches a maximum positive voltage when the signal field intensity is equal to the bias field intensity, as shown in FIG. 16B-2. In accordance with this condition, the resistance of magnetoresistive element 21 is at its minimum value, while the resistance of magnetoresistive element 22 remains unchanged. Thereafter, in response to a further increase in the intensity of the signal field $H_s$, the angle formed between the resultant field H through magnetoresistive element 21 and the main current conducting path thereof asymptotically approaches $-45°$, i.e., the angle formed between the resultant field H and magnetoresistive element 22. Thus, the resistance of magnetoresistive element 21 asymptotically approaches the resistance of magnetoresistance element 22. It should be appreciated that, as the signal field intensity $H_s$ increases, there is no change in the direction of the resultant magnetic field H as supplied to magnetoresistive element 22 and, therefore, there is no change in the resistance of this magnetoresistive element. The output voltage produced by the magnetic sensor thus is a function of the change in the resistance of magnetoresistive element 21.

Figure 16C:
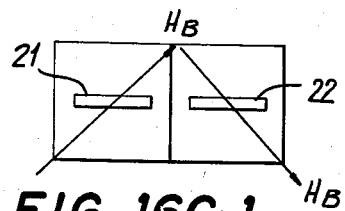
Figures 1, 16C:
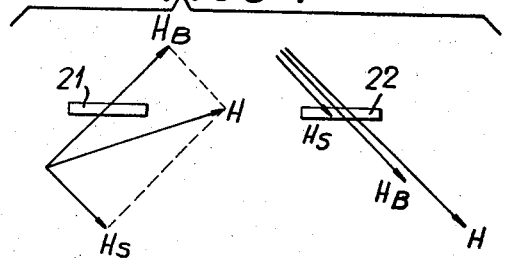
Figures 2, 16C:
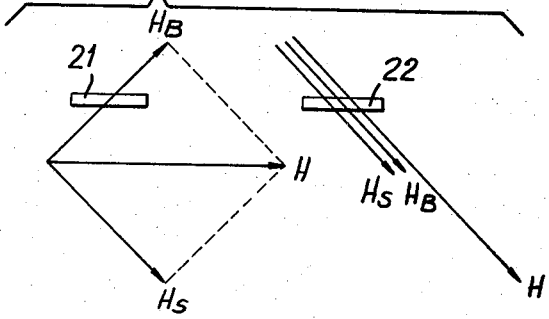
Figures 3, 16C:
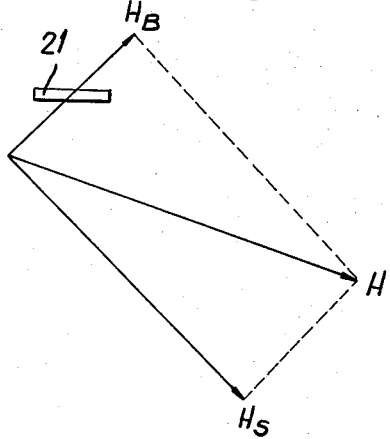

The manner in which the embodiment shown in FIG. 15C operates in response to an increase in the intensity of the signal field $H_s$ supplied thereto is represented by FIGS. 16C to 16C-3. The magnetoresistive elements are identified herein by reference numerals 21 and 22. As shown, the bias fields applied to the respective magnetoresistive elements are perpendicular to each other, and it may be assumed that the bias field applied to magnetoresistive element 21 is at an angle of $+45°$ to the main current conducting path, while the bias field applied to magnetoresistive element 22 is at an angle of −45° with respect to the main current conducting path. It is appreciated that the angle formed by the resultant field H through magnetoresistive element 21 and the main current conducting path thereof as the signal field intensity increases, as shown in FIGS. 16C-1 to 16C-3 is substantially identical to that discussed hereinabove with respect to FIGS. 16A-1 to 16A-3. With respect to magnetoresistive element 22, since the signal field $H_S$ is supplied in the same direction as the bias field $H_B$, the resultant field H is maintained at a constant angle of −45° with respect to the main current conducting path of this element. Hence, as the signal field intensity increases, there is no change in the resistance of this magnetoresistive element because there is no change in the angle formed between the main current conducting path thereof and the resultant field therethrough. Therefore, the output voltage derived from the magnetic sensor of FIG. 16C exhibits the same relationship with the signal field intensity as that of the magnetic sensor shown in FIG. 16A.

Figure 17:
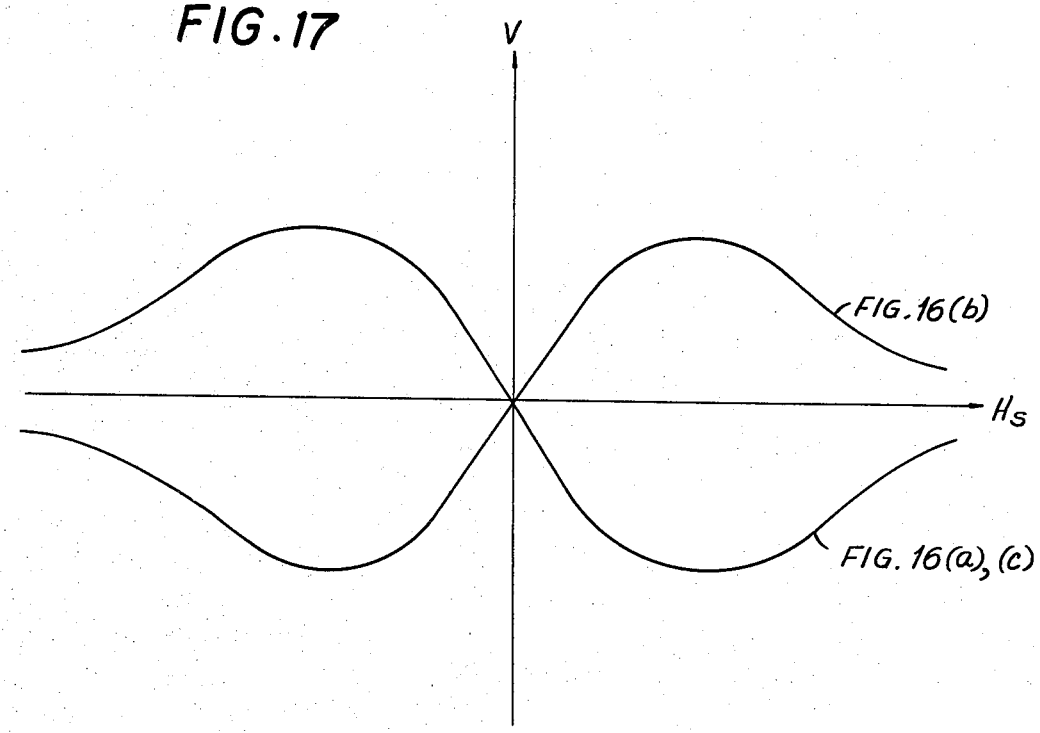
FIG. 17 presents graphical representations of the operation of the embodiments shown in FIGS. 16A-16C.

The relationships between the output voltage V and the signal field intensity $H_S$ for the conditions shown in FIGS. 16A to 16A-3, 16B to 16B-3 and 16C to 16C-3 are graphically represented in FIG. 17.

Figure 18I:
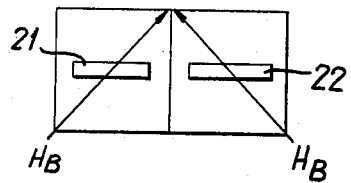
FIGS. 18(I)-18(V) are schematic representations of further operation of the embodiment shown in FIG. 15B.
Figure 18I:
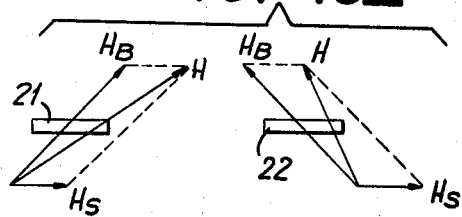
Figure 18I:
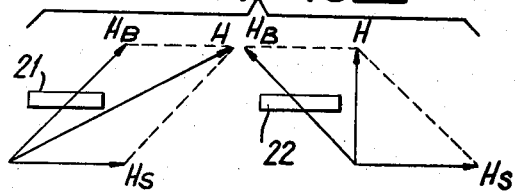
Figure 18I:
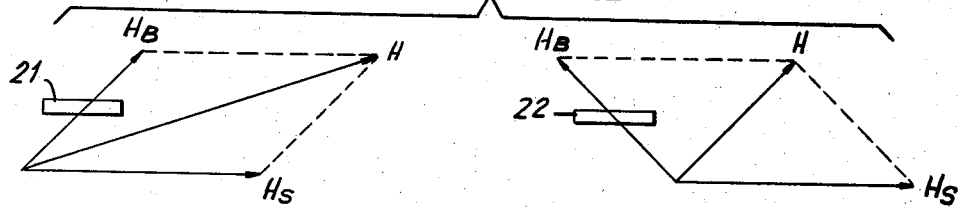
Figure 18V:
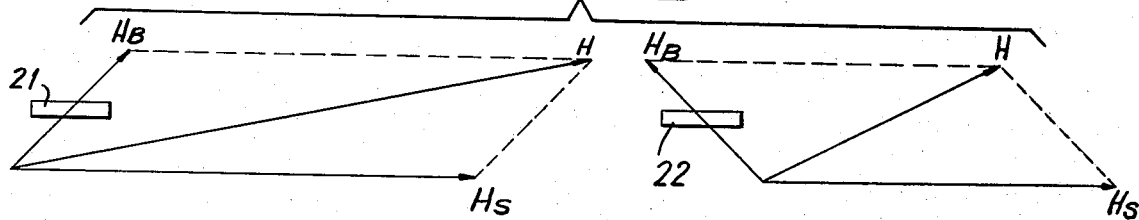

In discussing the operation of the embodiment shown in FIG. 16A in response to an increasing signal field intensity, it has been assumed that the signal field $H_S$ is supplied in a direction which is perpendicular to the bias field $H_B$ applied to magnetoresistive element 21. That is, it is assumed that the signal field $H_S$ is supplied at an angle of, for example, 45° with respect to the main current conducting path of each of the magnetoresistive elements. FIG. 18I is identical to the embodiment of the magnetic sensor discussed previously with respect to FIG. 16A. Let it now be assumed that the signal field $H_S$ is supplied to magnetoresistive elements 21 and 22 in a direction parallel to the main current conducting paths thereof. In FIG. 18II, it is assumed that the signal field intensity is less than the bias field intensity. Hence, the resultant field H through magnetoresistive element 21 forms an angle of less than 45° with respect to the main current conducting path thereof, thereby increasing the resistance of this magnetoresistive element. With respect to magnetoresistive element 22, the angle formed between the resultant magnetic field H and the main current conducting path increases toward 90°, thereby reducing the resistance of magnetoresistive element 22. Hence, the output voltage produced by this magnetic sensor is increased in the negative direction.

If the signal field intensity $H_S$ is further increased, it is seen that the angle formed between the resultant field H through magnetoresistive element 21 and the main current conducting path thereof is further reduced toward 0°, while the angle formed between the resultant field H through magnetoresistive element 22 and the main current conducting path thereof is increased toward 90°. When the angle between the resultant field H and the main current conducting path of element 22 is equal to 90°, the resistance of element 22 is reduced to its minimum. At that time, the output voltage derived from the magnetic sensor is at its maximum negative level. Thereafter, and as represented by FIGS. 18IV and 18V, further increases in the intensity of the signal field $H_S$ tends to reduce the angle between the resultant field H and the main current conducting path in each magnetoresistive element toward 0°. Thus, the resistances of magnetoresistive elements 21 and 22 asymptotically approach equal values. This means that the output voltage V derived from the magnetic sensor asymptotically approaches a zero level subsequent to its reaching a maximum negative level.

Figure 19:
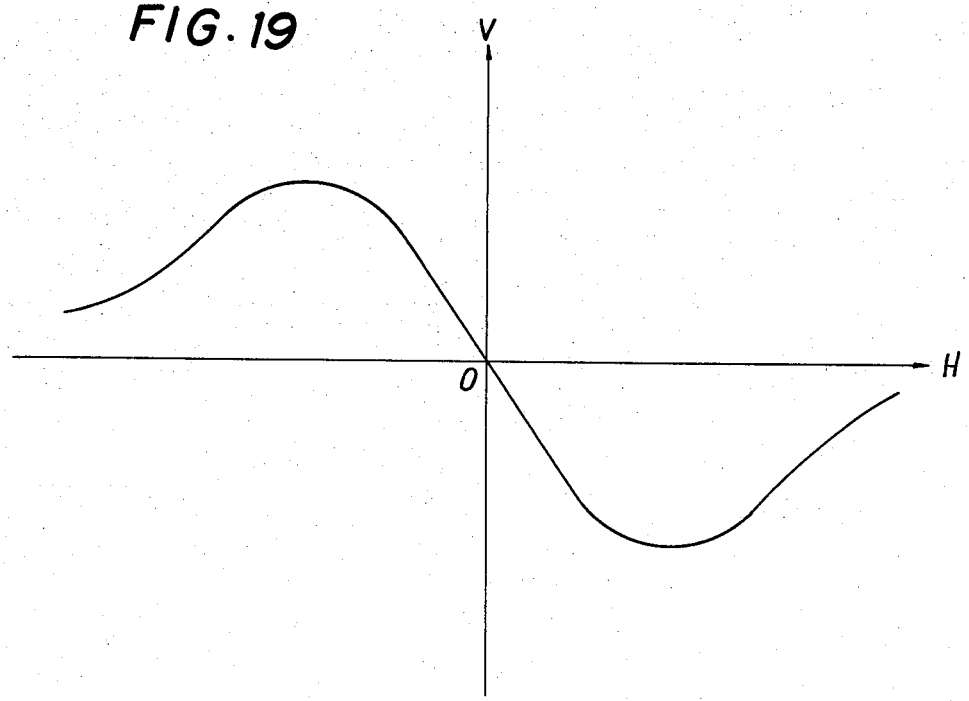
FIG. 19 is a graphical representation of the output voltage produced by the embodiment shown in FIG. 18 in response to the application of an external magnetic field.

FIG. 19 is a graphical representation of the relationship between the output voltage V and the intensity of the signal field $H_S$ for the conditions shown in FIGS. 18II-18V.

While the present invention has been particularly shown and described with reference to certain preferred embodiments, it should be readily apparent to those of ordinary skill in the art that various changes and modifications in form and details can be made without departing from the spirit and scope of the invention. It is, therefore, intended that the appended claims be interpreted as including all such changes and modifications.

What is claimed is:

1. Apparatus for sensing an external magnetic field to produce an output signal whose magnitude corresponds to the strength of said external magnetic field and is substantially insensitive to deviations in the direction of said external magnetic field, comprising a magnetic field sensor have only two coplanar magnetoresistive elements, each magnetoresistive element having a main current conducting path and each magnetoresistive element having anisotropic resistance as a function of the direction of the resultant magnetic field applied thereto, and bias means for supplying first and second equal bias magnetic fields to said first and second magnetoresistive elements, respectively, the intensity of the bias fields being sufficient to saturate said first and second magnetoresistive elements, said first bias magnetic field being supplied at an angle with respect to the first main current conducting path which differs from the angle at which said second bias magnetic field is supplied with respect to the second main current conducting path, said first and second magnetoresistive elements being connected in series with each other; said apparatus further comprising means for supplying a d.c. current to said series-connected first and second magnetoresistive elements; and means coupled to the junction defined by said series-connected first and second magnetoresistive elements to produce an output signal representing the magnitude of an external magnetic field as supplied to said first and second magnetoresistive elements, whereby said output signal is substantially immune to angular displacements of said magnetic field sensor relative to said external magnetic field.

2. Apparatus for producing an output signal in response to an applied external magnetic field, the magnitude of said output signal corresponding to the strength of said external magnetic field, comprising a magnetic field sensor having first and second coplanar series-connected magnetoresistive elements, each magnetoresistive element having a main current conducting path and each magnetoresistive element having anisotropic resistance as a function of the direction of the resultant magnetic field applied thereto, bias means for supplying first and second equal bias magnetic fields to said first and second magnetoresistive elements, respectively, said field and second bias magnetic fields being supplied at different fixed angles with respect to said first and second main current conducting paths; means for supplying a d.c. current to said series-connected first and second magnetoresistive elements; and means coupled to the junction defined by said series-connected first and second magnetoresistive elements to produce an output signal representing the magnitude of an external magnetic field as supplied to said first and second magnetoresistive elements, wherein said output signal remains substantially constant regardless of the angle at which said external field is supplied to said first and second magnetoresistive elements when the magnitude of said supplied external magnetic field is approximately equal to the magnitude of said bias magnetic fields.

3. The apparatus of claim 2 wherein said bias means comprises first and second bias magnets to which said first and second magnetoresistive elements are respectively coupled.

4. The apparatus of claim 1, wherein said first and second magnetoresistive elements are spaced apart from each other.

5. The apparatus of claim 1, wherein said first and second main current conducting paths are perpendicular to each other; and said first and second bias magnetic fields are opposite to each other.

6. The apparatus of claim 5 wherein one of said bias magnetic fields is parallel to one of said main current conducting paths.

7. The apparatus of claim 1, wherein said first and second main current conducting paths extend in the same direction; and said first and second bias magnetic fields are opposite to each other and at respective predetermined angles with respect to said first and second main current conducting paths.

8. The apparatus of claim 7 wherein said first bias magnetic field is supplied at an angle of +45° with respect to said first main current conducting path and said second bias magnetic field is supplied at an angle of −135° with respect to said second main current conducting path.

9. The apparatus of claim 1, wherein said first and second main current conducting paths extend in the same direction; and said first and second bias magnetic fields are perpendicular to each other.

10. The apparatus of claim 9 wherein said first bias magnetic field is supplied at an angle of +45° with respect to said first main current conducting path and said second bias magnetic field is supplied at an angle of +135° with respect to said second main current conducting path.

11. The apparatus of claim 9 wherein said first bias magnetic field is supplied at an angle of +45° with respect to said first main current conducting path and said second bias magnetic field is supplied at an angle of −45° with respect to said second main current conducting path.

12. The apparatus of claim 9 wherein said first bias magnetic field is supplied at an angle of −45° with respect to said first main current conducting path and said second bias magnetic field is supplied at an angle of −135° with respect to said second main current conducting path.

13. The apparatus of claim 1 wherein said means to produce an output signal comprises first and second series-connected resistance means connected across said series-connected magnetoresistive elements; and output terminals connected to the junction defined by the series-connected resistance means and the junction defined by the series-connected magnetoresistive elements, respectively, for providing said output signal thereacross.

14. The apparatus of claim 13 wherein said first and second resistance means are of predetermined resistive value such that said output signal is substantially equal to zero when the intensity of the external magnetic field as supplied to said magnetoresistive elements is equal to zero.

15. The apparatus of claim 1 wherein each of said magnetoresistive elements consists of ferromagnetic strips deposited on an insulating substrate in serpentine configuration.

16. The apparatus of claim 1 further comprising third and fourth coplanar magnetoresistive elements, each of said third and fourth magnetoresistive elements having a main current conducting path and each having anisotropic resistance as a function of the direction of the resultant magnetic field applied thereto; said third and fourth magnetoresistive elements being connected in series with each other and having an output terminal coupled to the junction defined by the series-connection thereof; bias means for supplying third and fourth equal but opposite bias magnetic fields to said third and fourth magnetoresistive elements, respectively; said first, second, third and fourth magnetoresistive elements being connected in bridge configuration; and said means to produce an output signal comprises another output terminal coupled to the junction defined by the series-connected first and second magnetoresistive elements, said output signal being produced across said output terminals.

* * * * *